(12) United States Patent
Chung et al.

(10) Patent No.: US 11,658,190 B2
(45) Date of Patent: May 23, 2023

(54) DISPLAY APPARATUS HAVING A SILICON NITRIDE BUFFER LAYER AND METHOD OF MANUFACTURING THE SAME

(71) Applicant: SAMSUNG DISPLAY CO., LTD., Yongin-si (KR)

(72) Inventors: Yungbin Chung, Yongin-si (KR); Yeoungkeol Woo, Yongin-si (KR); Eunjin Kwak, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 323 days.

(21) Appl. No.: 17/134,585

(22) Filed: Dec. 28, 2020

(65) Prior Publication Data

US 2021/0288083 A1   Sep. 16, 2021

(30) Foreign Application Priority Data

Mar. 13, 2020  (KR) .................. 10-2020-0031314

(51) Int. Cl.
| | |
|---|---|
| *H01L 27/12* | (2006.01) |
| *H01L 27/15* | (2006.01) |
| *H01L 51/00* | (2006.01) |
| *H01L 51/52* | (2006.01) |
| *H01L 27/32* | (2006.01) |
| *H01L 25/16* | (2023.01) |

(52) U.S. Cl.
CPC ........ *H01L 27/1262* (2013.01); *H01L 27/124* (2013.01); *H01L 27/1237* (2013.01); *H01L 27/3244* (2013.01); *H01L 25/167* (2013.01); *H01L 27/1248* (2013.01); *H01L 27/15* (2013.01)

(58) Field of Classification Search
CPC .............. H01L 27/1262; H01L 27/124; H01L 27/3244; H01L 27/1248; H01L 27/1237; H01L 27/15; H01L 27/1255; H01L 27/3258

See application file for complete search history.

(56) References Cited

U.S. PATENT DOCUMENTS

| | | | |
|---|---|---|---|
| 6,861,328 B2 | 3/2005 | Hara et al. | |
| 7,338,855 B2 | 3/2008 | Lee et al. | |
| 7,851,260 B2 | 12/2010 | Jung et al. | |
| 8,497,524 B2 | 7/2013 | Utumi | |

(Continued)

FOREIGN PATENT DOCUMENTS

| | | |
|---|---|---|
| KR | 10-0644046 | 11/2006 |
| KR | 10-2007-0076860 | 7/2007 |

(Continued)

OTHER PUBLICATIONS

Chemistry by Zamdahl (5th Ed.) Table 8.4 on p. 373.

(Continued)

*Primary Examiner* — Mohsen Ahmadi
(74) *Attorney, Agent, or Firm* — F. Chau & Associates, LLC

(57) ABSTRACT

A display apparatus includes a substrate. A first buffer layer is disposed over the substrate. The first buffer layer includes silicon nitride and has an atomic percentage of hydrogen bonded to silicon of about 0.36 to about 1.01. A thin film transistor is disposed over the first buffer layer. The thin film transistor includes an active layer. A display element is electrically connected to the thin film transistor.

16 Claims, 8 Drawing Sheets

(56) References Cited

U.S. PATENT DOCUMENTS

| | | | |
|---|---|---|---|
| 10,020,352 B2 | 7/2018 | Chung et al. | |
| 2008/0203528 A1* | 8/2008 | Shih | H01L 28/40 |
| | | | 257/532 |
| 2016/0260792 A1* | 9/2016 | Kim | H01L 27/3276 |
| 2016/0322449 A1* | 11/2016 | Pyon | H01L 27/3276 |
| 2017/0365651 A1* | 12/2017 | Lee | H01L 27/3276 |
| 2018/0012947 A1* | 1/2018 | Lee | H01L 27/3265 |
| 2018/0247597 A1* | 8/2018 | An | H01L 27/3223 |
| 2019/0006521 A1* | 1/2019 | Noh | H01L 27/1248 |
| 2020/0111854 A1* | 4/2020 | Chung | H01L 27/3262 |
| 2020/0185489 A1* | 6/2020 | Jo | H01L 27/3265 |
| 2020/0266260 A1* | 8/2020 | Park | H01L 27/3276 |
| 2022/0020836 A1* | 1/2022 | Gong | H01L 51/56 |

FOREIGN PATENT DOCUMENTS

| | | |
|---|---|---|
| KR | 10-0829466 | 5/2008 |
| KR | 10-2011-0040616 | 4/2011 |
| KR | 10-2017-0043726 | 4/2017 |

OTHER PUBLICATIONS

T P. Smirnova, et al., "The Mechanism of Dehydrogenation Of SiNX:H Films," Thin Solid Films 293, pp. 6-10, 1997.

H.J. Stein, et al., "Post-Deposition High Temperature Processing of Silicon Nitride," Thin Solids Films, 101 (1983) pp. 291-298.

* cited by examiner

DISPLAY APPARATUS HAVING A SILICON NITRIDE BUFFER LAYER AND METHOD OF MANUFACTURING THE SAME

CROSS-REFERENCE TO RELATED APPLICATION

This application claims priority under 35 U.S.C. § 119 to, and the benefit of, Korean Patent Application No. 10-2020-0031314, filed on Mar. 13, 2020, in the Korean Intellectual Property Office, the disclosure of which is herein incorporated by reference in its entirety.

TECHNICAL FIELD

The present disclosure relates to a display apparatus, and more particularly, to a display apparatus having a silicon nitride buffer layer and a method of manufacturing the display apparatus.

DISCUSSION OF RELATED ART

In general, a display apparatus includes display elements that are used to display images. Display apparatuses are available in various types and may be used in various electronic devices such as smartphones, digital cameras, laptop computers, navigation devices, or a smart televisions.

Display apparatuses generally control the operation of each display element disposed therein by using a thin film transistor that is electrically connected to each of the display elements.

SUMMARY

According to one or more embodiments, a display apparatus includes a substrate. A first buffer layer is disposed over the substrate. The first buffer layer includes silicon nitride and has an atomic percentage of hydrogen bonded to silicon of greater than about 0.36 and equal to or less than about 1.01. A thin film transistor is disposed over the first buffer layer. The thin film transistor includes an active layer. A display element is electrically connected to the thin film transistor.

The display apparatus may further include a second buffer layer disposed between the first buffer layer and the thin film transistor.

The second buffer layer may include silicon oxide.

The thin film transistor may include a gate electrode and the active layer, and the active layer may be closer to the first buffer layer than the gate electrode is to the first buffer layer.

The gate electrode may include aluminum.

The gate electrode may include a first layer including aluminum, and a second layer disposed on the first layer. The second layer may include a material having an etch ratio that is less than an etch ratio of aluminum.

The gate electrode may include a first layer including aluminum, and a second layer disposed on the first layer. The second layer may include titanium.

The gate electrode may include a first layer including aluminum, and a second layer disposed on the first layer. The second layer may include titanium nitride.

The gate electrode may further include a third layer disposed on the second layer, the third layer may include titanium.

According to one or more embodiments, a method of manufacturing a display apparatus includes forming a first buffer layer on a substrate. The first buffer layer includes silicon nitride and has an atomic percentage of hydrogen bonded to silicon of greater than about 0.36 and equal to or less than about 1.01. A thin film transistor is formed over the first buffer layer. The thin film transistor includes an active layer. A display element is electrically connected to the thin film transistor.

The method may further include forming a second buffer layer on the first buffer layer.

The forming of the thin film transistor may include forming a thin film transistor over the second buffer layer. The thin film transistor may include an active layer.

The forming of the second buffer layer may include forming a silicon oxide layer.

The forming of the thin film transistor may include forming an active layer and forming a gate electrode over the active layer.

The forming of the gate electrode may include using a material including aluminum.

The forming of the gate electrode may include forming a first temporary layer by using a material including aluminum, forming a second temporary layer on the first temporary layer by using a material having an etch ratio that is less than an etch ratio of aluminum, and simultaneously patterning the first and second temporary layers to form the gate electrode.

The forming of the gate electrode may include forming a first temporary layer by using a material including aluminum, forming a second temporary layer on the first temporary layer by using a material including titanium, and simultaneously patterning the first and second temporary layers to form the gate electrode.

The forming of the gate electrode may include forming a first temporary layer by using a material including aluminum, forming a second temporary layer on the first temporary layer by using a material including titanium nitride, and simultaneously patterning the first and second temporary layers to form the gate electrode.

The forming of the gate electrode may include forming a first temporary layer by using a material including aluminum, forming a second temporary layer on the first temporary layer by using a material including titanium nitride, forming a third temporary layer on the second temporary layer by using a material including titanium, and simultaneously patterning the first to third temporary layers to form the gate electrode.

The forming of the first buffer layer may include forming the first buffer layer by using only nitrogen gas and silane gas.

The forming of the first buffer layer may include forming the first buffer layer by maintaining a flow rate of nitrogen gas to be at least 160 times a flow rate of the silane gas.

A display apparatus includes a substrate. A buffer layer is disposed on the substrate. The buffer layer includes silicon nitride. A thin film transistor is disposed on the buffer layer. The thin film transistor is configured to control a display element.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
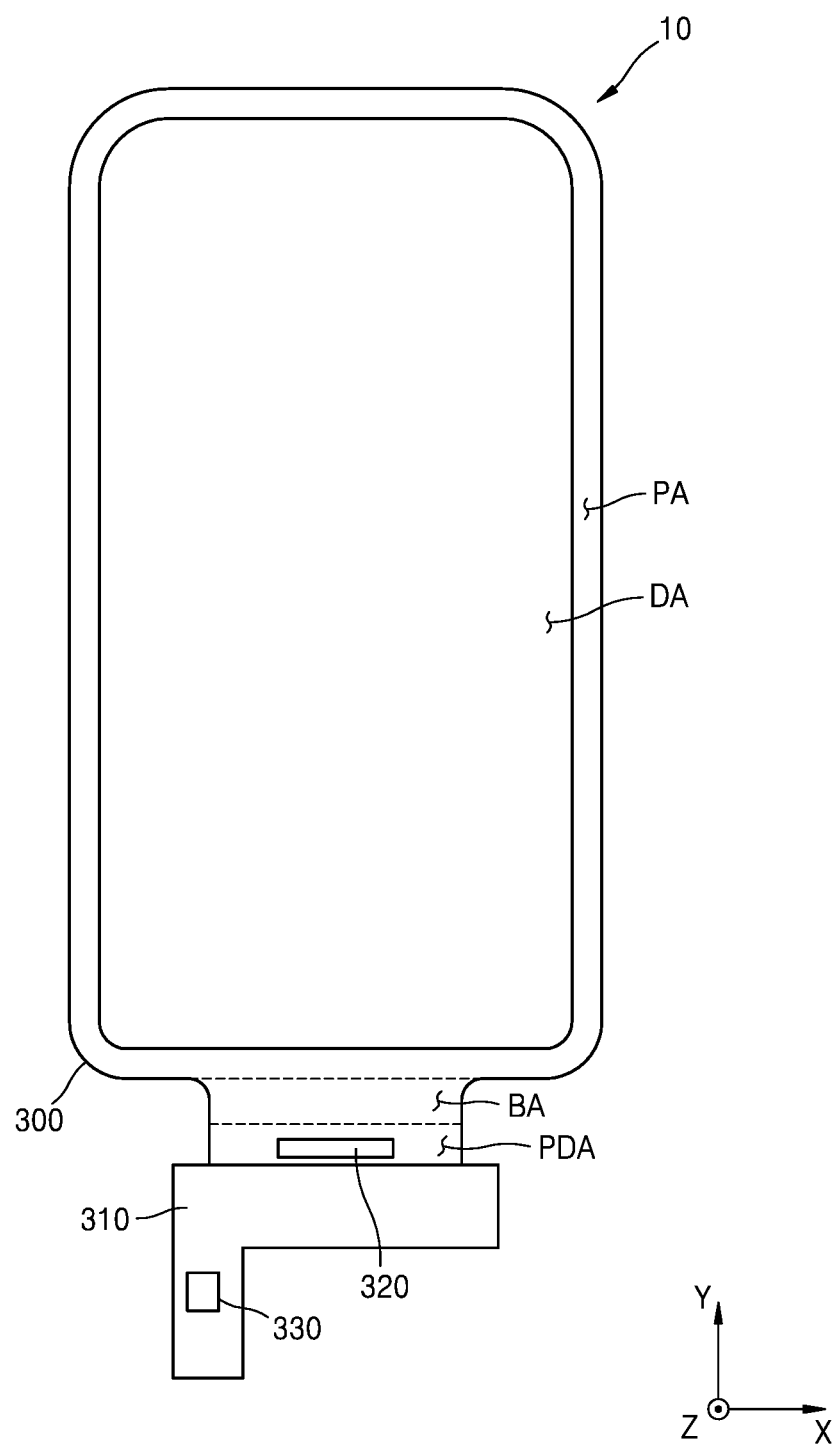
FIG. 1 is a plan view illustrating a portion of a display apparatus according to an exemplary embodiment of the present disclosure.

Reference will now be made in detail to embodiments, examples of which are illustrated in the accompanying drawings, wherein like reference numerals may refer to like elements throughout the specification and the drawings. In this regard, the present embodiments may have different forms and should not necessarily be construed as being limited to the descriptions set forth herein. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not necessarily be construed as being limited to the descriptions set forth herein.

The example embodiments will be described below in more detail with reference to the accompanying drawings. To the extent that a detailed description of an element has been omitted, it may be understood that the element is at least similar to a corresponding element that has been described elsewhere in the specification.

It will be understood that when an element such as a layer, film, region or substrate is referred to as being placed "on" another element, it can be directly placed on the other element, or an intervening layer(s) may also be present. Sizes of components in the drawings may be exaggerated for convenience of explanation.

The x-axis, the y-axis, and the z-axis are not necessarily limited to three axes of the rectangular coordinate system (i.e. the Cartesian coordinate system), and may be interpreted in a broader sense. For example, the x-axis, the y-axis, and the z-axis may be perpendicular to one another, or may represent different directions that are not necessarily perpendicular to one another.

According to an exemplary embodiment of the present disclosure, a display apparatus may include a substrate. A buffer layer may be disposed on the substrate. The buffer layer may include silicon nitride. A thin film transistor may be disposed on the buffer layer and the thin film transistor may be configured to control a display element.

Figure 2:
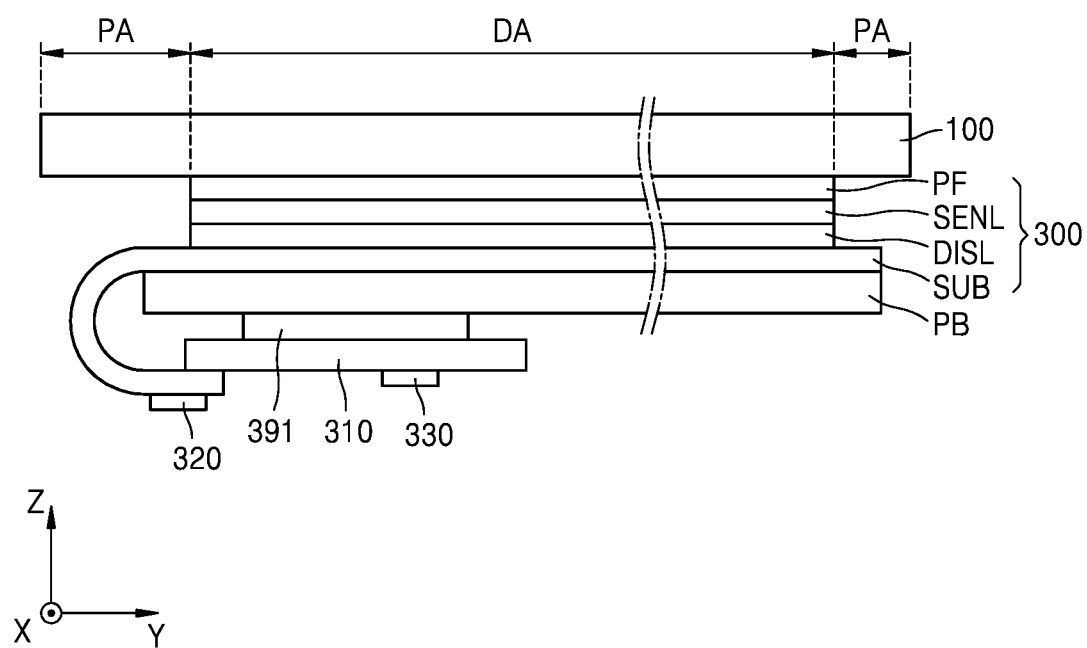
FIG. 2 is a side view of a display apparatus including elements of FIG. 1.

FIG. 1 is a plan view illustrating a portion of a display apparatus 10 according to an exemplary embodiment of the present disclosure, and FIG. 2 is a side view of the display apparatus 10 including elements shown in FIG. 1. In FIG. 2, a substrate SUB is flexible, and thus, a display panel 300 is bent at a bending area BA (see FIG. 1). FIG. 1 shows the display panel 300 in an unbent state for convenience of description.

Referring to FIG. 1 and FIG. 2, the display apparatus 10 displays videos or still images, and may be used as a display screen in portable electronic devices such as a mobile phone, a smart phone, a tablet personal computer (PC), a mobile communication terminal, an electronic notebook, an E-book reader, a portable multimedia player (PMP), a navigation device, an ultra mobile PC (UMPC), and also in various products such as a television, a laptop computer, a computer monitor, a digital billboard, internet of things (IoT) devices, etc. Also, the display apparatus 10 may be used in wearable devices such as a smart watch, a watch phone, a glasses-type display, and a head mounted display (HMD). In addition, the display apparatus 10 may be used in a dashboard of a vehicle, a center information display in a center fascia or dashboard of a vehicle, a display that replaces a side-view mirror of a vehicle, a display mounted at a rear side of a front seat of a vehicle that is used as an entertainment device for a back seat passenger, etc.

FIGS. 1 and 2 shows that the display apparatus 10, according to the aforementioned embodiment, is used in a smart phone for convenience of description. The display apparatus 10, according to the aforementioned embodiment, includes a cover window 100, a display panel 300, a display circuit board 310, a display driver 320, a sensor driver 330, a panel bottom cover PB, etc. The display apparatus 10 may further include a bracket, a main circuit board, a battery, a lower cover, etc., in addition to the above-mentioned elements.

Hereinafter, "upper portion" denotes a direction in which the cover window 100 is located, relative to the display panel 300, that is, +z direction. Hereinafter, "lower portion" denotes an opposite direction relative to the display panel 300, that is, −z direction. Also, "left" and "right" sides respectively denote left and right directions when the display panel 300 is seen from a direction perpendicular to the display panel 300 (as shown in FIG. 1). For example, "left" denotes −x direction and "right" denotes +x direction.

When the display apparatus 10 is seen from a direction perpendicular to a surface thereof, the display apparatus 10 may have a rectangular shape as shown in FIG. 1. For example, the display apparatus 10 may have a planar shape at least similar to a rectangle having shorter sides in a first direction (x-axis direction) and longer sides in a second direction (y-axis direction) as shown in FIG. 1. A corner where the shorter side in the first direction and the longer side in the second direction meet each other may have a rounded shape having a particular curvature or a right-angled shape. The planar shape of the display apparatus 10 is not limited to the rectangular shape, that is, the planar shape of the display apparatus 10 may have another polygonal shape, a circular shape, or an elliptical shape.

As shown in FIG. 2, the cover window 100 may be disposed on the display panel 300 so as to cover an upper surface of the display panel 300. The cover window 100 may protect the upper surface of the display panel 300 from damage by external contact or exposure.

The display panel 300 may be under the cover window 100. The display panel 300 may overlap a transmitting portion of the cover window 100. The display panel 300 may include the substrate SUB and a display element on the substrate SUB. For example, as illustrated in FIG. 2, the display panel 300 includes the substrate SUB, a display layer DISL, a sensor electrode layer SENL, and a polarization film PF.

The display panel 300 displays (e.g. outputs) information processed in the display apparatus 10. For example, the display panel 300 may display information pertaining to an execution of an application installed on a device associated with the display apparatus 10 or a user interface (UI) or a graphical user interface (GUI) information according to the execution screen information. The display panel 300 may include the display layer DISL displaying images and the sensor electrode layer SENL sensing a touch input of a user. As such, the display panel 300 may function as an input device, and at the same time, may function as an output device.

The substrate SUB in the display panel 300 may include an insulating material such as glass, quartz, a polymer resin, etc. The substrate SUB may be a rigid substrate or a flexible substrate that may be bendable, foldable, and rollable. As used herein, "flexible," "bendable," and "rollable" may refer to an element that may be flexed, bent, or rolled to a non-trivial degree without sustaining damage. In FIG. 2, the substrate SUB is flexible, and thus, the display panel 300 is bent at the bending area BA (see FIG. 1). In FIG. 2, only the substrate SUB is bent, but the present invention is not necessarily limited thereto. The display layer DISL and the sensor electrode layer SENL may extend into, and so may be partially located in, the bending area BA (see FIG. 1) and/or a pad region, and in this case, the display layer DISL and the sensor electrode layer SENL may be partially bent at the bending area BA. In addition, the polarization film PF may extend into, and so may be partially located in the bending area BA, and in this case, the polarization film PF may also be bent at the bending area BA.

The substrate SUB includes a display area DA and a peripheral area PA on an outer portion of the display area DA, and the display element is disposed on the display area DA of the substrate SUB. The display layer DISL of FIG. 2 may include the display element. For example, the display layer DISL may include a thin film transistor layer including a thin film transistor, a display layer including a display element such as an organic light-emitting device, and an encapsulation layer for encapsulating the display layer.

The peripheral area PA of the substrate SUB might not display images. The peripheral area PA may at least partially surround the display area DA. The peripheral area PA may include an area from an edge of the display area DA to an edge of the display panel 300. The display area DA may include scan lines, data lines, power lines, etc. connected to pixels, as well as the pixels themselves. The peripheral area might not include any pixels. The peripheral area PA may include a scan driver for applying scan signals to the scan lines, fan-out lines connecting the data lines to the display driver 320, etc.

FIG. 2 shows that the display area DA is only located in a flat portion of the substrate SUB for convenience of description, but the present invention is not necessarily limited thereto. For example, the display element may be disposed on the bent portion of the substrate SUB, and in this case, the bent portion of the substrate SUB may be included in the display area DA.

The display element may include, for example, a light-emitting element. In more detail, the display panel 300 may include an organic light-emitting display panel using an organic light-emitting diode including an organic light-emitting layer. The display panel 300 may include a micro LED display panel using a micro LED. The display panel 300 may include a quantum dot light-emitting display panel using a quantum dot light-emitting diode including a quantum dot light-emitting layer. Alternatively, the display panel 300 may include an inorganic light-emitting display panel using an inorganic light-emitting device including inorganic semiconductor.

The sensor electrode layer SENL includes a sensor area in which sensor electrodes are located, and the sensor area may at least partially overlap the display area DA. The sensor area may be an area configured for sensing a touch input from the user. Sensor electrodes, connectors, and conductive patterns may be disposed in the sensor area. Sensor lines connected to the sensor electrodes may be disposed in a sensor peripheral area that is at an outer portion of the sensor area.

The sensor electrode layer SENL may be configured to sense the touch input from the user by using at least one of various touch methods such as a resistive overlay method, a capacitive overlay method, etc. For example, when the sensor electrode layer SENL senses the touch input of the user in the capacitive overlay method, the sensor driver 330 applies driving signals to driving electrodes from among the sensor electrodes, and the sensor driver 330 senses voltages charged in mutual capacitance between the driving electrodes and the sensing electrodes via the sensing electrodes from among the sensor electrodes to determine the touch of the user. The touch of the user may include an actual touch, in which contact is made between the user or a stylus and the cover window 100, and a proximity touch, in which the user or stylus is brought close but contact is not made with the cover window 100. The sensor driver 330 is configured to transfer sensor data to a main processor according to sensed voltages, and the main processor is configured to analyze the sensor data to calculate a touch coordinate where the touch input occurs.

The polarization film PF may be disposed on the sensor electrode layer SENL. The polarization film PF may include a linear polarization plate and a phase retardation film such as a λ/4 (quarter wave) plate. The phase retardation film may be disposed on the sensor electrode layer SENL, and the linear polarization plate may be disposed on the phase retardation film.

The display panel 300 may include a rigid display panel, that might not be easily bendable, or a flexible display panel, that is flexible to be bendable, foldable, or rollable. For example, the display panel 300 may include a foldable display panel, a curved display panel, in which at least a part of display surface may be curved, a bent display panel in which a region rather than the display surface is bent, a rollable display panel, or a stretchable display panel.

The display panel 300 may be transparent. In this case, due to the transparency of the display panel 300, the user may see an object or a background under the display panel 300 from above the display panel 300. Alternatively, the display panel 300 may include a reflective type display panel that may reflect an image of an object or a background above the display panel 300.

In addition, as described above, the display panel 300 has the bending area BA at one side thereof (e.g. in the −y direction) and may be bent at the bending area BA as shown in FIG. 2. For example, FIG. 1 shows the display panel 300 in an unbent state for convenience of description. As the display panel 300 is bent, the pad area PDA is located below (e.g. in −z direction) another portion in the display panel 300. Then, the pad area PDA may at least partially overlap the display area DA in a thickness direction (e.g. z-axis direction) of the display panel 300. The display driver 320, the display circuit board 310, etc. may be disposed in the pad area PDA.

The display driver 320 receives control signals and power voltages, and generates and outputs signals and voltages for driving the display panel 300. The display driver 320 may include an integrated circuit (IC).

The display circuit board 310 may be electrically connected to the display panel 300. For example, as shown in FIG. 2, the display circuit board 310 may be electrically connected to the pad area PDA of the substrate SUB via an anisotropic conductive film.

The display circuit board 310 may include a flexible printed circuit board (FPCB) that is bendable or a rigid printed circuit board (PCB) that is hard and is not bendable. Alternatively, the display circuit board 310 may be a composite printed circuit board including both the rigid PCB and the FPCB.

The sensor driver 330 may be disposed on the display circuit board 310. The sensor driver 330 may include an integrated circuit. The sensor driver 330 may be attached to the display circuit board 310. The sensor driver 330 may be electrically connected to sensor electrodes in the sensor electrode layer SENL of the display panel 300 via the display circuit board 310.

Moreover, a power supplier for supplying driving voltages for driving the pixels of the display panel 300, the scan driver, and the display driver 320, etc. may be additionally disposed on the display circuit board 310. Alternatively, the power supplier may be integrated with the display driver 320, and in this case, the display driver 320 and the power supplier may be implemented within a common integrated circuit.

In addition, the display circuit board 310 may be electrically connected to a main circuit board. The main circuit board may include, e.g., a main processor including an integrated circuit, a camera device, a wireless communicator, an input unit, an output unit, an interface unit, a memory, and/or a power supplier.

The panel bottom cover PB may be disposed on a lower portion of the display panel 300. The panel bottom cover PB may be bonded to a lower surface of the display panel 300 via an adhesive member. The adhesive member may include a pressure sensitive adhesive (PSA). The panel bottom cover PB may include a light absorbing member for absorbing external light, a shock absorbing member for absorbing shock from outside, and/or a heat dissipation member for effectively discharging the heat from the display panel 300.

The light absorbing member may be disposed below the display panel 300. The light absorbing member blocks light transmission so as to prevent elements below the light absorbing member, e.g., the display circuit board 310, etc. from being visible from above the display panel 300. The light absorbing member may include a light absorbing material such as black pigment, black dye, etc.

The shock absorbing member may be disposed below the light absorbing member. The shock absorbing member absorbs external shock to prevent damage to the display panel 300. The shock absorbing member may have a single-layered or a multi-layered structure. For example, the shock absorbing member may include a polymer resin such as polyurethane, polycarbonate, polypropylene, polyethylene, etc., or an elastic material such as a sponge formed by foaming rubber, a urethane-based material, or an acrylic-based material.

The heat dissipation member may be disposed below the shock absorbing member. The heat dissipation member may include a first heat dissipation layer including graphite, carbon nano-tube, etc. A second heat dissipation layer, including a metal thin film such as copper, nickel, ferrite, etc., may be used to shield electromagnetic waves. The second heat dissipation layer, including the metal thin film, may have excellent thermal conductivity.

Figure 3:
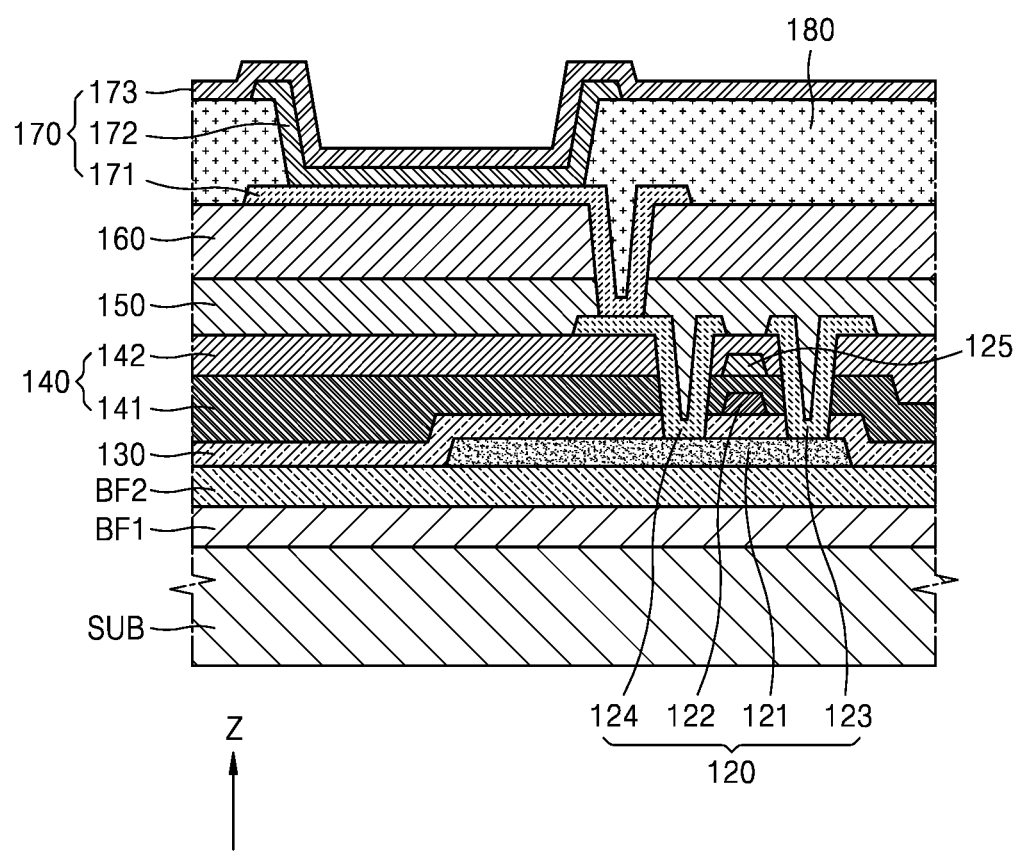
FIG. 3 is a cross-sectional view illustrating the portion of the display apparatus of FIG. 1.

FIG. 3 is a cross-sectional view illustrating a portion of the display apparatus 10 of FIG. 1. For example, FIG. 3 shows the substrate SUB and the display layer DISL (see FIG. 2).

Referring to FIG. 3, a first buffer layer BF1, a second buffer layer BF2, a thin film transistor 120, and a display element 170 may each be disposed on the substrate SUB.

The first buffer layer BF1 may be disposed on one surface of the substrate SUB. The first buffer layer BF1 may protect the thin film transistor 120 and an intermediate layer 172 of the display element 170 against moisture infiltrating through the substrate SUB. The first buffer layer BF1 includes silicon nitride. In the first buffer layer BF1, an atomic percentage of hydrogen bonded to silicon is greater than about 0.36 and equal to or less than about 1.01. For example, a ratio of the number of hydrogen atoms bonded to silicon with respect to the number of all atoms in the first buffer layer BF1 is expressed in a percentage that is greater than about 0.36 and equal to or less than about 1.01.

The second buffer layer BF2 may be disposed on the first buffer layer BF1. Unlike the first buffer layer BF1, the second buffer layer BF2 may include silicon oxide.

A thin film transistor layer that is disposed on the first buffer layer BF1, may be more specifically disposed on the second buffer layer BF2. Such a thin film transistor layer may include the thin film transistor 120, a gate insulating layer 130, an interlayer insulating layer 140, a first planarization layer 150, and a second planarization layer 160.

The thin film transistor 120 includes an active layer 121, a gate electrode 122, a source electrode 123, and a drain electrode 124. FIG. 3 shows the thin film transistor 120 of a top gate type, in which the gate electrode 122 is disposed on the active layer 121 such that the active layer 121 is closer to the first buffer layer BF1 than the gate electrode 122 is to the first buffer layer BF1, but the present invention is not necessarily limited thereto. For example, the thin film transistor 120 may be of a double gate type which further includes an additional gate electrode under the active layer 121.

The active layer 121 may be disposed on the first buffer layer BF1, e.g., on the second buffer layer BF2. The active layer 121 may include polycrystalline silicon, single-crystalline silicon, low temperature polycrystalline silicon, amorphous silicon, or oxide semiconductor. For example, the oxide semiconductor may include a binary compound (ABx), a ternary compound (ABxCy), or a quaternary compound (ABxCyDz) containing indium, zinc, gallium, tin, titanium, aluminum, hafnium (Hf), zirconium (Zr), or magnesium (Mg). Alternatively, the active layer 121 may include ITZO (oxide including indium, tin, and titanium) or IGZO (oxide including indium, gallium, and tin). A light blocking layer may be disposed below the active layer 121, and the light blocking layer may have a single-layered or multi-layered structure including molybdenum (Mo), aluminum (Al), chromium (Cr), gold (Au), titanium (Ti), nickel (Ni), neodymium (Nd), copper (Cu), and/or an alloy thereof.

The gate insulating layer 130 may be disposed on the active layer 121. The gate insulating layer 130 may include an inorganic layer including silicon nitride, silicon oxynitride, silicon oxide, titanium oxide, or aluminum oxide.

The gate electrode 122 and a gate line may be disposed on the gate insulating layer 130. The gate electrode 122 may at least partially overlap the active layer 121. The gate electrode 122 and/or the gate line may have a single-layered or multi-layered structure including aluminum. Here, the gate electrode 122 including aluminum may further include an aluminum alloy. This will be also applied to embodiments and modifications thereof that will be described later. The gate electrode 122 may be integrally provided with the gate line, and a portion of the gate line overlapping the active layer 121 may be referred to as the gate electrode 122.

The interlayer insulating layer 140 may be disposed on the gate electrode 122 and the gate line. The interlayer insulating layer 140 may include an inorganic layer including silicon nitride, silicon oxynitride, silicon oxide, titanium oxide, or aluminum oxide. The interlayer insulating layer 140 may have a single-layered or multi-layered structure. In FIG. 3, the interlayer insulating layer 140 has a multi-layered structure including a first interlayer insulating layer 141 and a second interlayer insulating layer 142. In this case, as shown in FIG. 3, a wiring 125 may be disposed between the first interlayer insulating layer 141 and the second interlayer insulating layer 142. The wiring 125 may at least partially overlap, for example, the gate electrode 122 or the gate line, to form a capacitor with the gate electrode 122 or the gate line. The wiring 125 may include aluminum like the gate electrode 122, and may have the same layered structure as that of the gate electrode 122 that will be described later. Here, the wiring 125 including aluminum also includes aluminum alloy. This will be also applied to embodiments and modifications thereof that will be described later.

The source electrode 123 and the drain electrode 124 may be disposed on the interlayer insulating layer 140. Each of the source electrode 123 and the drain electrode 124 may contact the active layer 121 via a contact hole penetrating through the interlayer insulating layer 140 and the gate insulating layer 130. The source electrode 123 and the drain electrode 124 may each have a single-layered or multi-layered structure including molybdenum (Mo), aluminum (Al), chromium (Cr), gold (Au), titanium (Ti), nickel (Ni), neodymium (Nd), and copper (Cu), and/or an alloy thereof. For example, the source electrode 123 and the drain electrode 124 may have the same structure as that of the gate electrode 122 that will be described later.

The first planarization layer 150 may be disposed on the source electrode 123 and the drain electrode 124, and the first planarization layer 150 planarizes a step caused by the thin film transistor 120. The first planarization layer 150 may include an insulating organic material such as an acryl resin, an epoxy resin, a phenolic resin, a polyamide resin, a polyimide resin, etc.

The second planarization layer 160 may be disposed on the first planarization layer 150. The second planarization layer 160 may also include an insulating organic material such as an acryl resin, an epoxy resin, a phenolic resin, a polyamide resin, a polyimide resin, etc. Various wirings including a conductive material may be between the first planarization layer 150 and the second planarization layer 160.

The display layer is disposed on the thin film transistor layer. The display layer may include the display element 170 and a pixel defining layer 180. The display element 170 and the pixel defining layer 180 may be disposed on the second planarization layer 160.

The display element 170 may include an organic light-emitting device as shown in FIG. 3. The organic light-emitting device may include a pixel electrode 171, an intermediate layer 172 including an emission layer, and an opposite electrode 173.

The pixel electrode 171 may be disposed on the second planarization layer 160. In FIG. 3, the pixel electrode 171 is connected to the drain electrode 124 of the thin film transistor 120 via a contact hole penetrating through the first planarization layer 150 and the second planarization layer 160, but the present invention is not necessarily limited thereto. For example, an intermediate conductive layer may be between the first planarization layer 150 and the second planarization layer 160, the intermediate conductive layer may be connected to the drain electrode 124 of the thin film transistor 120 via a contact hole in the first planarization layer 150, and then, the pixel electrode 171 may be connected to the intermediate conductive layer via a contact hole in the second planarization layer 160. The pixel electrode 171 may be electrically connected to the source electrode 123, rather than to the drain electrode 124.

In a top emission display apparatus, in which the light is discharged to outside through the opposite electrode 173 from the intermediate layer 172 including the emission layer, the pixel electrode 171 may include a metal material having a high reflectivity, for example, a stack structure including aluminum and titanium (Ti/Al/Ti), a stack structure including aluminum and ITO (ITO/Al/ITO), an APC alloy, and a stack structure including an APC alloy and ITO (ITO/APC/ITO). The APC alloy is an alloy of silver (Ag), palladium (Pd), and/or copper (Cu). As used herein, the phrase "high reflectivity" is understood to mean a reflectivity at least equal to that of one or more of the aforementioned high reflectivity materials.

In a bottom emission type display apparatus, in which the light is discharged to outside through the pixel electrode 171 from the intermediate layer 172 including the emission layer, the pixel electrode 171 may include a transparent conductive material (TCO) such as ITO and IZO that may transmit the light, or a semi-transmissive conductive material such as magnesium (Mg), silver (Ag), or an alloy of magnesium (Mg) and silver (Ag).

The pixel defining layer 180 may cover edges of each pixel electrode 171. The pixel defining layer 180 may include an organic material such as an acryl resin, an epoxy resin, a phenolic resin, a polyamide resin, a polyimide resin, etc.

The intermediate layer 172 including the emission layer is disposed on the pixel electrode 171 and the pixel defining layer 180. The intermediate layer 172 may include a hole transport layer, an electron transport layer, etc. in addition to the emission layer. The emission layer included in the intermediate layer 172 may be patterned to correspond to each of the pixel electrodes 171 as shown in FIG. 3. The hole transport layer, the electron transport layer, etc., rather than the emission layer, may be patterned to correspond to each of the pixel electrodes 171, or may be integrally provided throughout the plurality of pixel electrodes 171. The emission layer may be also integrally provided throughout the plurality of pixel electrodes 171. In this case, a color filter, a quantum dot filter, etc. may be disposed on a light path to realize full-color display.

The opposite electrode 173 is on the intermediate layer 172 including the emission layer. A capping layer may be disposed on the opposite electrode 173. In the top emission type display apparatus, the opposite electrode 173 may include a transparent conductive material (TCO) such as ITO and IZO that may transmit the light, or a semi-transmissive conductive material such as magnesium (Mg), silver (Ag), or an alloy of magnesium (Mg) and silver (Ag). In the bottom emission type display apparatus, the opposite electrode 173 may include a metal material having a high reflectivity, such as a stack structure including aluminum and titanium (Ti/Al/Ti), a stack structure of aluminum and ITO (ITO/Al/ITO), an APC alloy, and a stack structure of an APC alloy and ITO (ITO/APC/ITO). The APC alloy is an alloy of silver (Ag), palladium (Pd), and/or copper (Cu).

An encapsulation layer is disposed on the display element 170, e.g., on the opposite electrode 173. The encapsulation layer includes an inorganic layer and an organic layer and may prevent infiltration of oxygen or moisture into the intermediate layer 172 including the emission layer and the opposite electrode 173. For example, the encapsulation layer may include a first inorganic layer disposed on the opposite electrode 173, an organic layer disposed on the first inorganic layer, and a second inorganic layer disposed on the organic layer. The first and second inorganic layers may include silicon nitride, silicon oxynitride, silicon oxide, titanium oxide, or aluminum oxide. The organic layer may include an acryl resin, an epoxy resin, a phenolic resin, a polyamide resin, a polyimide resin, etc.

The encapsulation layer extends to the outer side of the display area, and the first and second inorganic layers may contact each other on the outer portion of the display area.

The sensor electrode layer SENL may be disposed on the encapsulation layer. The sensor electrode layer SENL may include, as described above, driving electrodes, sensing electrodes, sensor wirings, sensor insulating layers, etc.

As described above, the first buffer layer BF1 disposed between the substrate SUB and the thin film transistor 120 includes silicon nitride. In addition, in the first buffer layer BF1, an atomic percentage of hydrogen bonded to silicon is greater than about 0.36 and equal to or less than about 1.01. As such, excellent performance of the display apparatus 10 may be maintained while increasing electrical efficiency of the display apparatus 10.

As resistances of the gate electrode 122 and the wirings connected to the gate electrode 122 are lowered, an electrical efficiency of the display apparatus 10 including the gate electrode 122 and the wirings may be increased. Therefore, the gate electrode 122 may include, rather than molybdenum, a conductive material having a lower resistance than that of the molybdenum. Thus, the gate electrode 122 may include aluminum. For example, the gate electrode 122 may include aluminum or an alloy thereof. This is because aluminum has lower resistance than that of molybdenum.

However, when the gate electrode 122 has a single-layered structure including aluminum, the gate electrode 122 or gate lines may be damaged while the gate electrode 122 or the gate lines are formed. Because an etch ratio of aluminum is higher than those of other metal materials such as molybdenum, issues such as disconnection of gate lines may occur while the layer including aluminum is formed and patterned.

Figure 4:
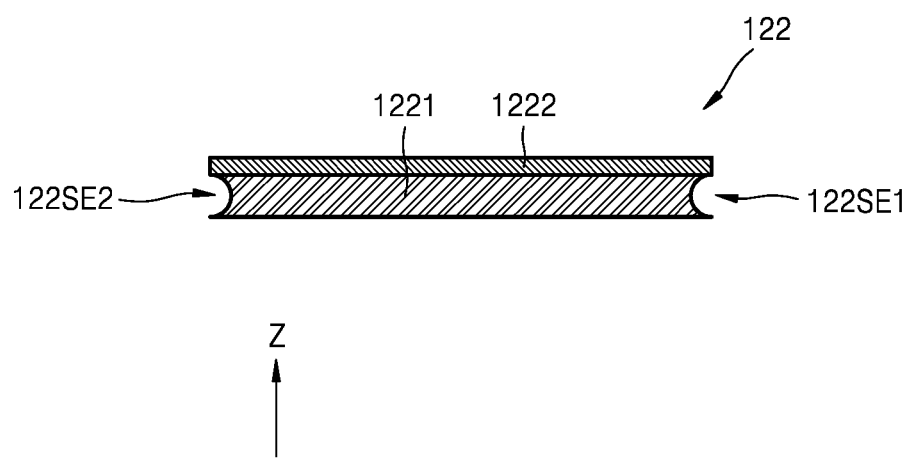
FIG. 4 is a cross-sectional view illustrating a portion of the display apparatus of FIG. 1.

Therefore, as shown in the cross-sectional view of FIG. 4 illustrating a portion of the display apparatus 10 of FIG. 1, the gate electrode 122 may include a first layer 1221 including aluminum, and a second layer 1222 disposed on the first layer 1221, the second layer 1222 including a material having a lower etch ratio than that of aluminum. In this case, during manufacturing processes, a first temporary layer including aluminum and a second temporary layer disposed on the first temporary layer are formed. The second temporary layer includes a material having a lower etch ratio than that of aluminum, and the first and second temporary layers are simultaneously patterned to form the gate electrode 122 and the gate lines. Because the second temporary layer having the relatively low etch ratio protects the first temporary layer during the patterning process, disconnection of the gate lines may be effectively prevented or reduced. The second layer 1222 may include titanium or titanium nitride. Because an etch ratio of the material included in the second layer 1222 is lower than that of the material included in the first layer 1221, the first layer 1221 is over-etched during the forming process thereof and opposite sides 122SE1 and 122SE2 of the first layer 1221 may be concave inwardly, as shown in FIG. 4.

Figure 5:
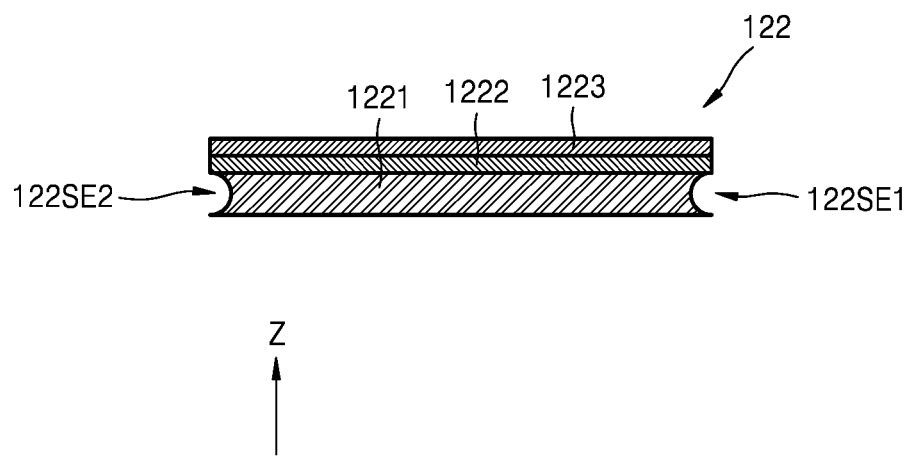
FIG. 5 is a cross-sectional view illustrating a portion of the display apparatus of FIG. 1.

Alternatively, as shown in the cross-sectional view of FIG. 5 illustrating a portion of the display apparatus 10 of FIG. 1, the gate electrode 122 may have a triple-layered structure. For example, the gate electrode 122 may include the first layer 1221 including aluminum, the second layer 1222 disposed on the first layer 1221, the second layer 1222 including titanium nitride, and a third layer 1223 disposed on the second layer 1222, the third layer 1223 including titanium. However, the present invention is not necessarily limited to this particular configuration. For example, the gate electrode 122 may have a triple-layered structure, in which an intermediate layer includes aluminum and upper and lower layers may each include titanium or titanium nitride. Because an etch ratio of the material included in the second layer 1222 and the third layer 1223 is lower than that of the material included in the first layer 1221, the first layer 1221 is over-etched during the forming process thereof and opposite sides 122SE1 and 122SE2 of the first layer 1221 may be concave inwardly, as shown in FIG. 5.

However, degradation in performance of the thin film transistor 120 may be reduced or prevented, even when the gate electrode 122 includes the conductive material having low resistance as described above. One of significant factors regarding the performance of the thin film transistor is a driving range. The thin film transistor may adjust an amount of current flowing between the source electrode and the drain electrode by adjusting, for example, a voltage applied to the gate electrode. The driving range denotes a range of voltage applied to the gate electrode, wherein the range may allow the amount of electric current flowing between the source electrode and the drain electrode to be variable. As the driving range increases, the amount of electric current flowing between the source electrode and the drain electrode may be finely controlled. On the other hand, as the driving range is reduced, it is difficult to accurately control the amount of electric current flowing between the source electrode and the drain electrode. When the driving range is narrow, a slight difference in the voltage applied to the gate electrode may greatly affect the amount of electric current flowing between the source electrode and the drain electrode.

In a case in which the thin film transistor 120 is a P-type thin film transistor and the gate electrode 122 includes molybdenum, when the first buffer layer BF1 below the thin film transistor includes silicon nitride, the driving range is −3.11 V. However, in a case of the P-type thin film transistor having the gate electrode 122 including the first layer 1221 including aluminum, the second layer 1222 including titanium nitride, and the third layer 1223 including titanium, when the first buffer layer BF1 below the thin film transistor includes silicon nitride, the driving range is reduced to −2.50

V. In particular, as a thickness of the third layer 1223 including titanium is increased in the gate electrode 122 having the triple-layered structure, the driving range is reduced. For example, when a thickness of the second layer 1222 including titanium nitride is 300 Å and a thickness of the third layer 1223 including titanium is 700 Å, the driving range is reduced to −2.50 V, and when the thickness of the second layer 1222 including titanium nitride is 300 Å and the thickness of the third layer 1223 including titanium is 1200 Å, the driving range is reduced to −2.42 V.

However, in the display apparatus 10 according to the aforementioned embodiment, the first buffer layer BF1 between the substrate SUB and the thin film transistor 120 includes silicon nitride, but a percentage of hydrogen atoms bonded to silicon in the first buffer layer BF1 is greater than about 0.36 and equal to or less than about 1.01. In this case, even when the gate electrode 122 includes the first layer 1221 including aluminum and the second layer 1222 including titanium or titanium nitride on the first layer 1221 or the gate electrode 122 includes the first layer 1221 including aluminum, die second layer 1222 including titanium nitride on the first layer 1221, and the third layer 1223 including titanium on the second layer 1222, the driving range of the thin film transistor 120 might not be reduced. As such, excellent performance of the display apparatus 10 may be maintained while increasing electrical efficiency of the display apparatus.

Figure 6:
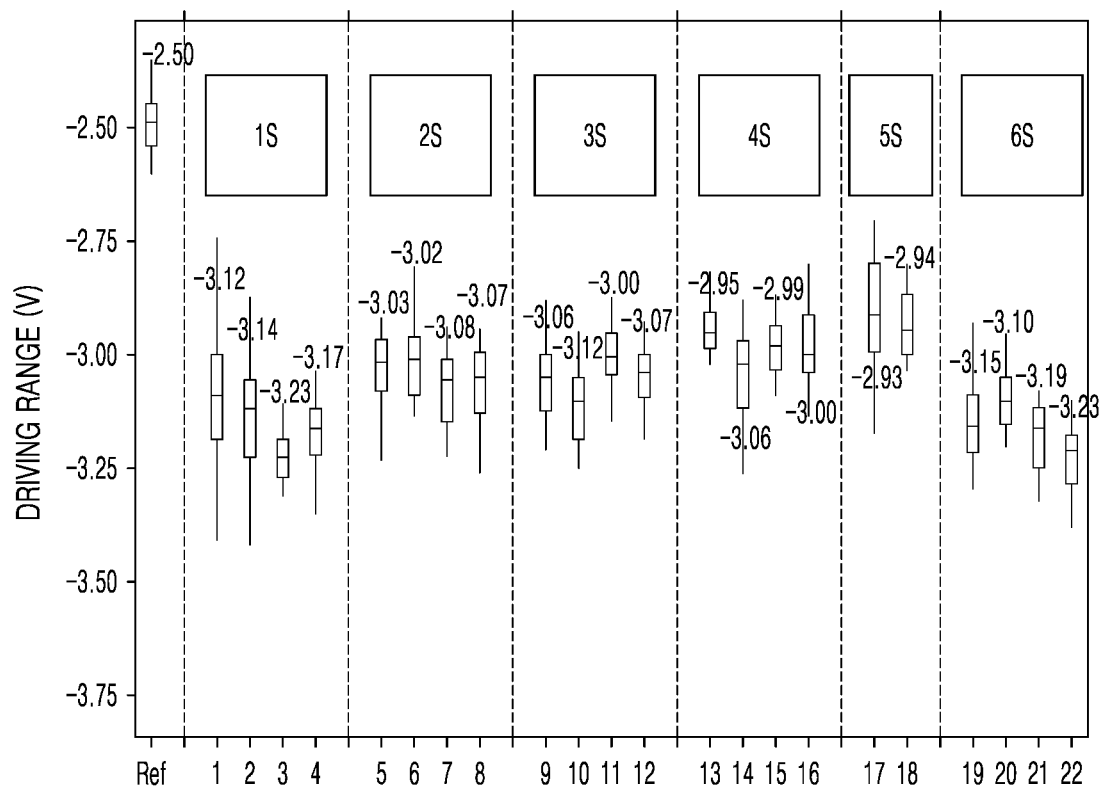
FIG. 6 is a graph illustrating a driving range of a thin film transistor included in the display apparatus of FIG. 1 versus driving ranges of thin film transistors according to a comparative example.

FIG. 6 is a graph illustrating a driving range of a thin film transistor included in the display apparatus 10 of FIG. 1 versus a driving range of a thin film transistor according to a comparative example.

As shown in FIG. 6, the display apparatuses 10 were manufactured six times and a driving range of a thin film transistor 120 in each display apparatus 10 was measured. In each of first to fourth cases 1S to 4S and sixth case 6S, four display apparatuses 10 were manufactured and driving ranges of thin film transistors 120 were measured, and in fifth case 5S, two display apparatuses 10 were manufactured and driving ranges of thin film transistors 120 were measured.

As expressed by "Ref" in FIG. 6, in the gate electrode 122 including a P-type thin film transistor 120 having the first layer 1221 including aluminum, the second layer 1222 including titanium nitride, and the third layer 1223 including titanium, when the first buffer layer BF1 below the thin film transistor includes 20 silicon nitride, the driving range was narrow, e.g., −2.50 V. However, as expressed by numbers 1 to 22 in FIG. 6, when the first buffer layer BF1 between the substrate SUB and the thin film transistor 120 included silicon nitride and a percentage of hydrogen atoms bonded to silicon in the first buffer layer BF1 was greater than about 0.36 and equal to or less than about 1.01, the driving range was wide with an average of −3.14 V, and the widest driving range was −3.23 V. The above result is similar to or greater than −3.11 V that is the driving range in a case in which the gate electrode 122 includes a P-type thin film transistor 1Q including molybdenum and the first buffer layer BF1 below the thin film transistor 120 includes silicon nitride. Therefore, the display apparatus 10 according to the aforementioned embodiment may maintain the excellent performance while increasing the electrical efficiency.

Figure 7:
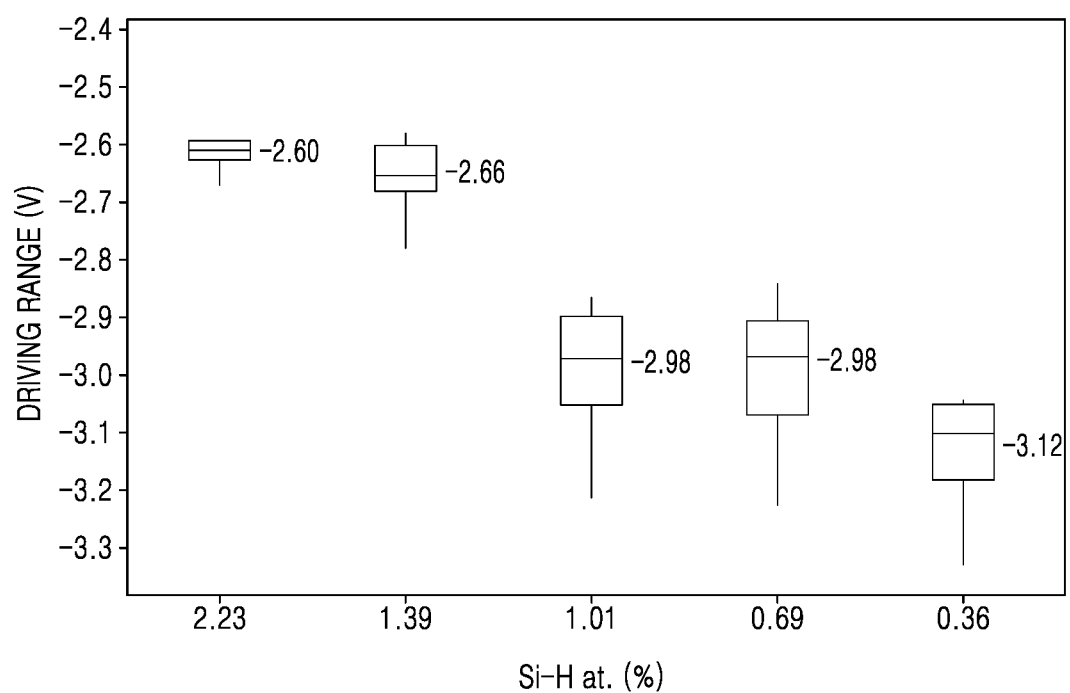
FIG. 7 is a graph illustrating a driving range of a thin film transistor according to atomic percentage of hydrogen bonded to silicon.

FIG. 7 is a graph illustrating a driving range of a thin film transistor according to a percentage of hydrogen atoms bonded to silicon in the first buffer layer BF1 including silicon nitride. As shown in FIG. 7, when the atomic percentage of hydrogen bonded to silicon in the first buffer layer BF1 including silicon nitride is equal to or less than about 1.01, the driving range of the thin film transistor has an appropriate range, that is, −2.98 V or −3.12 V. However, when the atomic percentage of hydrogen bonded to silicon in the first buffer layer BF1 including silicon nitride is greater than about 1.01, the driving range of the thin film transistor is rapidly reduced to −2.66 V or −2.60 V. Therefore, the atomic percentage of hydrogen bonded to silicon in the first buffer layer BF1 including silicon nitride may be maintained to be equal to or less than about 1.01.

Figure 8:
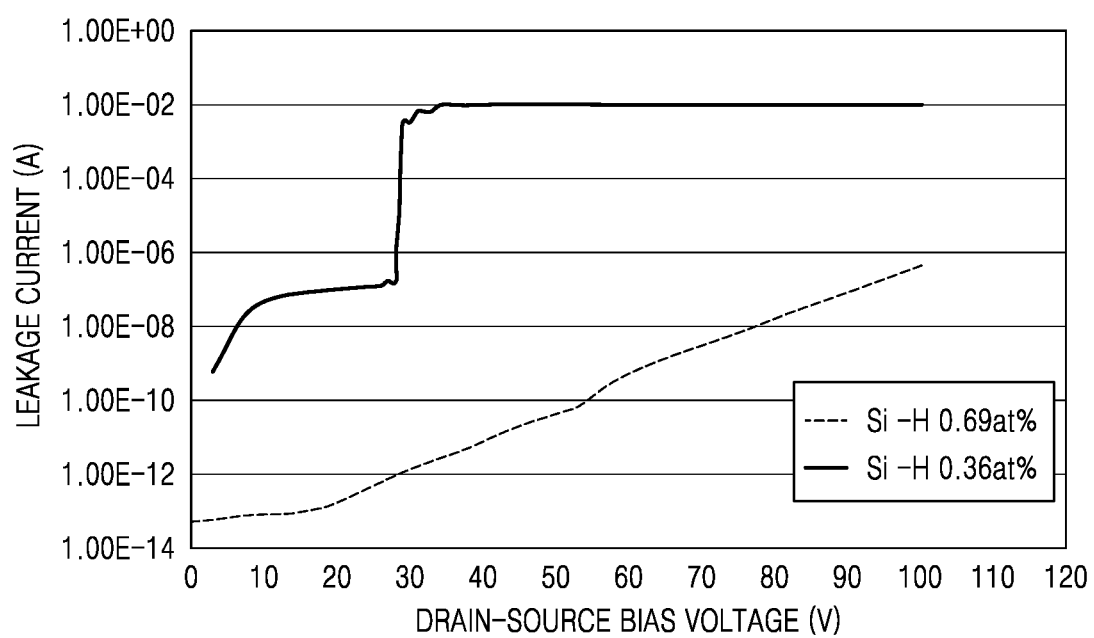
FIG. 8 is a graph illustrating a variation in leakage current of a thin film transistor according to atomic percentage of hydrogen bonded to silicon.

FIG. 8 is a graph illustrating a variation in leakage current of a thin film transistor according to atomic percentage of hydrogen bonded to silicon. When the atomic percentage of hydrogen bonded to silicon in the first buffer layer BF1 including silicon nitride was equal to or less than about 0.36 when a bias voltage was applied between the drain electrode and the source electrode of the thin film transistor, leakage current largely occurred at a certain voltage and the electrical insulating property rapidly degraded. However, when the atomic percentage of hydrogen bonded to silicon in the first buffer layer BF1 including silicon nitride was greater than about 0.36, the rapid degradation in the insulating property was not exhibited. Therefore, the atomic percentage of hydrogen bonded to silicon in the first buffer layer BF1 including silicon nitride may be maintained to be greater than about 0.36.

As a reference, when the atomic percentage of hydrogen bonded to silicon in the first buffer layer BF1 including silicon nitride is equal to or less than about 0.36, dangling bonds of silicon that is not bonded to hydrogen increase. The dangling bonds of silicon become paths of leakage current due to a quantum mechanical tunneling effect and cause rapid degradation in the insulating property in the silicon nitride layer.

Hereinafter, a method of manufacturing the display apparatus 10 according to an exemplary embodiment of the present disclosure will be described below. Descriptions about the materials included in the elements, descriptions of which are already provided above in the description about the display apparatus 10, are omitted. To the extent that a detailed description of an element has been omitted, it may be understood that the element is at least similar to a corresponding element that has been described elsewhere in the specification.

The first buffer layer BF1 is formed on the substrate SUB, and the first buffer layer BF1 includes silicon nitride and an atomic percentage of hydrogen bonded to silicon in the first buffer layer BF1 is greater than about 0.36 and equal to or less than about 1.01. In addition, the thin film transistor 120 including the active layer 121 and the gate electrode 122 on the active layer 121 is formed on the first buffer layer BF1. Before forming the thin film transistor 120, the second buffer layer BF2 including silicon oxide may be formed on the first buffer layer BF1.

The gate electrode 122 includes aluminum, as described above. For example, the first temporary layer is formed by using a material including aluminum and the second temporary layer is formed on the first temporary layer by using a material having a lower etch ratio than that of aluminum, and then, the first and second temporary layers are simultaneously patterned to form the gate electrode 122 and the gate lines connected to the gate electrode 122. The second temporary layer may be formed by using titanium or titanium nitride. When the second temporary layer is formed by using titanium nitride, a third temporary layer may be formed on the second temporary layer by using a material including titanium before patterning the first and second temporary layers, and the first to third temporary layers may be simultaneously patterned to form the gate electrode 122.

After that, the display element 170 electrically connected to the thin film transistor 120 is formed, and then, the display apparatus 10 may be manufactured.

As described above, when the display apparatus 10 according to the aforementioned embodiment is manufactured, the first buffer layer BF1 including silicon nitride is formed, wherein the atomic percentage of hydrogen bonded to silicon in the first buffer layer BF1 is greater than about 0.36 and equal to or less than about 1.01. As described above, the atomic percentage of hydrogen bonded to silicon in the first buffer layer BF1 in the display apparatus 10 according to the aforementioned embodiment is very small, for example, equal to or less than about 1.01.

As described above with reference to FIG. 7, when the atomic percentage of hydrogen bonded to silicon in the first buffer layer BF1 including silicon nitride is greater than about 1.01, the driving range of the thin film transistor is rapidly reduced to −2.66 V or −2.60 V. The driving range is reduced because hydrogen in the first buffer layer BF1 moves to the active layer 121 and acts as a carrier. Therefore, an amount of hydrogen in the first buffer layer BF1 may be reduced. Hydrogen existing in the first buffer layer BF1 is in a form of bonding with nitrogen or silicon, and bonding energy between nitrogen and hydrogen is much greater than that between silicon and hydrogen. Therefore, hydrogen bonded to nitrogen is less likely to move to the active layer 121, but some of hydrogen bonded to silicon is highly likely to move to the active layer 121 and to act as a carrier. Therefore, the amount of hydrogen bonded to silicon in the first buffer layer BF1 may be reduced, and as a result, the atomic percentage of hydrogen bonded to silicon in the first buffer layer BF1 may be maintained at about 1.01 or less, as described above.

The first buffer layer BF1 including silicon nitride may be formed by a CVD method. When a general silicon nitride layer is formed by the CVD method, a nitrogen gas, an ammonia gas, and a silane gas are used, and a ratio among flow rates of the nitrogen gas, the ammonia gas, and the silane gas is about 30:10:1. However, when the display apparatus 10 according to the aforementioned embodiment is manufactured, only the nitrogen gas and the silane gas are used. Because the ammonia gas is not used, more nitrogen gas is used, and as a result, hydrogen in the first buffer layer BF1 may be present in the form of being bonded to nitrogen, rather than silicon.

Moreover, when the first buffer layer BF1 is formed by the CVD method only by using the nitrogen gas and the silane gas, the first buffer layer BF1 is formed while maintaining the flow rate of the nitrogen gas to be 160 times the flow rate of the silane gas or more. As described above, in the first buffer layer BF1, the atomic percentage of hydrogen bonded to silicon is then maintained at about 1.01 or less. Because the silicon component in silicon nitride is derived from silane gas, the atomic percentage of hydrogen bonded to silicon may be maintained at about 1.01 or less by maintaining the flow rate of the nitrogen gas to be 160 times that of the silane gas or more. When the flow rate of the nitrogen gas is less than 160 times the flow rate of the silane gas, the silane gas is relatively increased, and thus, the atomic percentage of hydrogen bonded to silicon in the silicon nitride layer is greater than about 1.01.

According to one or more embodiments of the disclosure, the display apparatus having a high electrical efficiency while maintaining the excellent performance and the method of manufacturing the display apparatus may be implemented. However, the scope of the disclosure is not limited to the above effects.

It should be understood that embodiments described herein may be considered in a descriptive sense only and need not limit the invention to one particular embodiment thereof. Descriptions of features or aspects within each embodiment may be considered as available for other similar features or aspects in other embodiments. While one or more exemplary embodiments of the present disclosure have been described with reference to the figures, it will be understood by those of ordinary skill in the art that various changes in form and details may be made therein without departing from the spirit and scope of the present disclosure.

What is claimed is:

1. A display apparatus comprising:
   a substrate;
   a first buffer layer disposed on the substrate, the first buffer layer including silicon nitride and having an atomic percentage of hydrogen bonded to silicon of greater than 0.36 and equal to or less than 1.01;
   a thin film transistor disposed over the first buffer layer; and
   a display element electrically connected to the thin film transistor,
   wherein the thin film transistor comprises a gate electrode and an active layer and the active layer is closer to the first buffer layer than the gate electrode is to the first buffer layer, and
   wherein the gate electrode includes a first layer including aluminum, and a second layer disposed on the first layer, the second layer including a material having an etch ratio that is smaller than an etch ratio of aluminum.

2. The display apparatus of claim 1, further comprising a second buffer layer disposed between the first buffer layer and the thin film transistor.

3. The display apparatus of claim 2, wherein the second buffer layer includes silicon oxide.

4. The display apparatus of claim 1, wherein the gate electrode includes aluminum.

5. The display apparatus of claim 1, wherein the gate electrode includes a first layer including aluminum, and a second layer disposed on the first layer, the second layer including titanium.

6. The display apparatus of claim 1, wherein the gate electrode includes a first layer including aluminum, and a second layer disposed on the first layer, the second layer including titanium nitride.

7. The display apparatus of claim 6, wherein the gate electrode further comprises a third layer disposed on the second layer, the third layer including titanium.

8. A method of manufacturing a display apparatus, the method comprising:
   forming a first buffer layer on a substrate, the first buffer layer including silicon nitride and having an atomic percentage of hydrogen bonded to silicon of greater than 0.36 and equal to or less than 1.01;
   forming a thin film transistor over the first buffer layer; and
   forming a display element electrically connected to the thin film transistor,
   wherein the forming of the first buffer layer comprises forming the first buffer layer using only nitrogen gas and silane gas, and wherein the forming of the first buffer layer comprises forming the first buffer layer by maintaining a flow rate of nitrogen gas to be at least 160 times a flow rate of silane gas.

9. The method of claim 8, further comprising forming a second buffer layer on the first buffer layer,
wherein the forming of the thin film transistor comprises forming the thin film transistor over the second buffer layer.

10. The method of claim 9, wherein the forming of the second buffer layer comprises forming a silicon oxide layer.

11. The method of claim 8, wherein the forming of the thin film transistor comprises forming an active layer and forming a gate electrode over the active layer.

12. The method of claim 11, wherein the gate electrode is formed of a material including aluminum.

13. The method of claim 11, wherein the forming of the gate electrode comprises forming a first temporary layer using a material including aluminum, forming a second temporary layer on the first temporary layer using a material having an etch ratio that is less than an etch ratio of aluminum, and simultaneously patterning the first and second temporary layers to form the gate electrode.

14. The method of claim 11, wherein the forming of the gate electrode comprises forming a first temporary layer using a material including aluminum, forming a second temporary layer on the first temporary layer using a material including titanium, and simultaneously patterning the first and second temporary layers to form the gate electrode.

15. The method of claim 11, wherein the forming of the gate electrode comprises forming a first temporary layer using a material including aluminum, forming a second temporary layer disposed on the first temporary layer using a material including titanium nitride, and simultaneously patterning the first and second temporary layers to form the gate electrode.

16. The method of claim 11, wherein the forming of the gate electrode comprises forming a first temporary layer using a material including aluminum, forming a second temporary layer disposed on the first temporary layer using a material including titanium nitride, forming a third temporary layer disposed on the second temporary layer using a material including titanium, and simultaneously patterning the first to third temporary layers to form the gate electrode.

* * * * *